United States Patent
Ganatra (10) Patent No.: US 11,569,789 B2
(45) Date of Patent: Jan. 31, 2023

(54) COMPENSATION FOR AMBIENT SOUND SIGNALS TO FACILITATE ADJUSTMENT OF AN AUDIO VOLUME

(71) Applicant: Jawbone Innovations, LLC, Marshall, TX (US)

(72) Inventor: Nitin Ganatra, San Francisco, CA (US)

(73) Assignee: Jawbone Innovations, LLC, Marshall, TX (US)

( * ) Notice: Subject to any disclaimer, the term of this patent is extended or adjusted under 35 U.S.C. 154(b) by 0 days.

(21) Appl. No.: 17/494,616

(22) Filed: Oct. 5, 2021

(65) Prior Publication Data

US 2022/0140798 A1    May 5, 2022

Related U.S. Application Data

(63) Continuation of application No. 14/105,157, filed on Dec. 12, 2013, now Pat. No. 11,165,399.

(51) Int. Cl.
*H03G 3/24* (2006.01)
*H03G 3/32* (2006.01)

(52) U.S. Cl.
CPC ............... *H03G 3/24* (2013.01); *H03G 3/32* (2013.01)

(58) Field of Classification Search
None
See application file for complete search history.

(56) References Cited

U.S. PATENT DOCUMENTS 11,165,399 B2 * 11/2021 Ganatra .................. H03G 3/24

* cited by examiner

*Primary Examiner* — K. Wong
(74) *Attorney, Agent, or Firm* — Nutter McClennen & Fish LLP (57) ABSTRACT

Embodiments of the invention relate generally to audio device and wearable computing devices to detect and characterize an ambient sound, to adjust an output volume of an audio device. More specifically, disclosed are systems, components and methods to generate audio signals associated with an audio device and an output volume, receive ambient sound signals associated with an ambient sound source, detect the ambient sound signals reaching a threshold intensity, analyzing digital data representing the ambient sound and adjust the audio signals to change the output volume according to a category of the ambient sound signals.

20 Claims, 12 Drawing Sheets

FIG. 10

COMPENSATION FOR AMBIENT SOUND SIGNALS TO FACILITATE ADJUSTMENT OF AN AUDIO VOLUME

CROSS-REFERENCE TO RELATED APPLICATION(S)

This application is a continuation of, and therefore claims priority from, U.S. patent application Ser. No. 14/105,157, filed Dec. 12, 2013, and entitled "COMPENSATION FOR AMBIENT SOUND SIGNALS TO FACILITATE ADJUSTMENT OF AN AUDIO VOLUME", which is herein incorporated by reference for all purposes.

FIELD

Embodiments relate generally to electrical and electronic hardware, computer software, wired and wireless network communications, and audio devices for detection and characterization of an ambient sound, to adjust an output volume of an audio device. More specifically, an apparatus and method are configured to adjust an volume at which an audio device is propagating sound energy in response to an ambient sound.

BACKGROUND

Audio systems including an audio speaker or a headphone are used commonly in a variety of human activities. While modern audio systems generate audio with improved sound clarity and quality, conventional audio systems are not well-suited to respond to various ambient sounds in an environment that surrounds the audio system.

An example of a conventional audio system is a home audio system, such as a Bluetooth-enabled audio player with loudspeakers. When a user listens to music through the home audio system, the music volume typically remains the same or at a level at which a user initially adjusts the music volume. However, a change in the sounds of an environment can interfere with a listener's ability to enjoy music or otherwise perceive audio-related information, such as during a teleconference. For instance, when a user enters a shower, the relatively loud sounds of water tend to inference with the acoustic energy of the music, thereby causing difficulty in hearing the music. In other instances, when a guest rings a doorbell, the volume of the audio generated by an audio system may drown out the doorbell sound, leaving a listener unable to hear the doorbell, which, in turn, causes the door to go unanswered. Similarly, when a user picks up a phone call when the audio system is playing, the sound level of music may cause either the user to talk over the phone more loudly than is necessary or interfere with the caller's ability to hear the listener, or both.

Another example of the audio system is an audio headphone. When a runner listens to the music through an audio headset, the runner cannot hear the music while running through a loud area (e.g., a shopping area, or near a busy restaurant). However, in response to the increased ambient sound, if the runner substantially increases the music volume manually, the relatively loud levels of music may put the runner in danger because loud volume might conceal imminent alerting sound, such as sirens, or a sound of an automotive approaching behind the runner, such as hybrid automobile implementing battery power .

Thus, there is a need to dynamically modify volume of an audio system in response to different types of characterized ambient sounds.

BRIEF DESCRIPTION OF THE DRAWINGS

Various embodiments or examples ("examples") of the invention are disclosed in the following detailed description and the accompanying drawings.

DETAILED DESCRIPTION

Various embodiments or examples may be implemented in numerous ways, including as a system, a process, an apparatus, a user interface, or a series of program instructions on a computer readable medium such as a computer readable storage medium or a computer network where the program instructions are sent over optical, electronic, or wireless communication links. In general, operations of disclosed processes may be performed in an arbitrary order, unless otherwise provided in the claims.

A detailed description of one or more examples is provided below along with accompanying figures. The detailed description is provided in connection with such examples, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For clarity, technical material that is known in the technical fields related to the examples has not been described in detail to avoid unnecessarily obscuring the description.

Figure 1A:
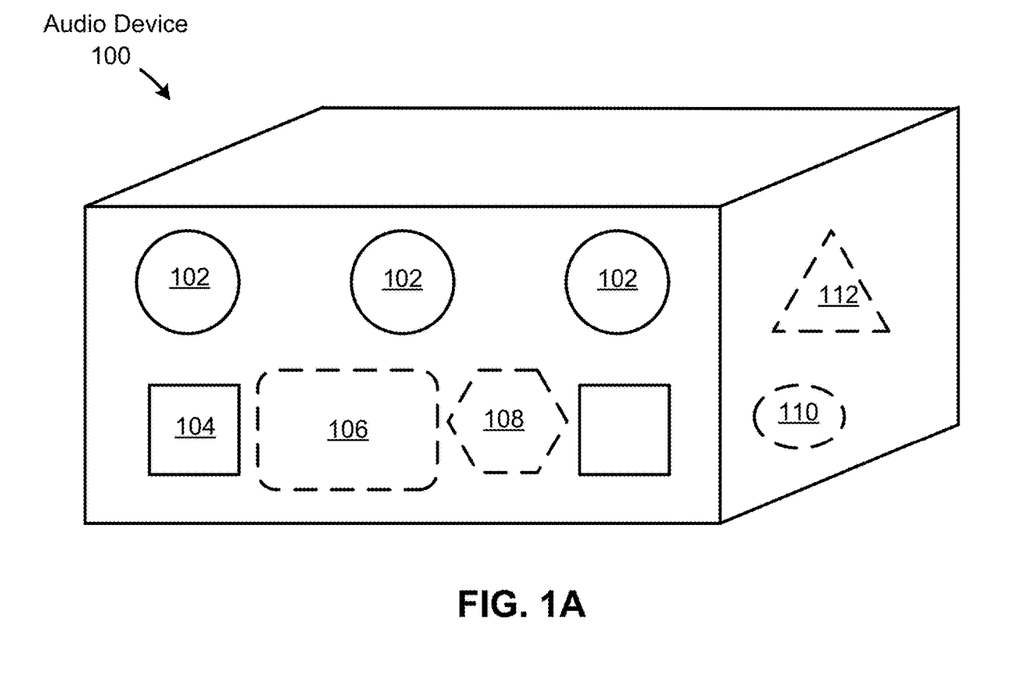
FIG. 1A illustrates an example of an audio device configured to adjust a level of volume of an audio signal, according to some embodiments.

FIG. 1A illustrates an example of an audio device configured to adjust a level of volume of an audio signal, according to some embodiments. In some embodiments, audio device 100 includes logic to detect audio-related data and to drive one or more loudspeakers, whereby audio device 100 can be implemented as an audio speaker, a wired or wireless audio speaker, a portable wireless Bluetooth® Speaker, or the like. Audio device 100 can house one or more transducers, including speakers 102 and a microphone 104. Speaker 102 is configured to convert electrical audio signals to corresponding acoustical signals, thus generating or propagating acoustic energy that represents audio (e.g., a sound). Microphone 104 is configured to convert acoustic signals of a sound into electrical audio signals, which are further processed by audio device 100.

Audio device 100 further includes an audio control processor 112 that can be configured to communicate with one or more components or modules (not shown) to receive data in communication (e.g., over a wireless network) with audio device 100. According to some embodiments, audio device 100 includes at least one sensor 110. Sensor 110 can be a location sensor which is configured to receive proximity digital data indicating a sound source location, or is otherwise configured to determine a position or direction from which a sound source originates, such as an ambient sound. Audio device 100 may further include an audio source 106 that is configure provide data representing any type of audio, such as voice data, music data, etc. Audio source 106 can be any type of known sound source, such as a radio source (e.g., logic configured to provide a broadcast RF radio, or Internet radio), a verbal communication source (e.g., a teleconference phone), a music player, or the like. Audio device 100 can include one or more converters 108, such as an analog-to-digital (A/D) converter for digitizing sounds from an environment, including voices and ambient sounds. In some embodiments, the audio device may further include a memory, an audio amplifier ("AMP"), and a power source (not shown).

Figure 1B:
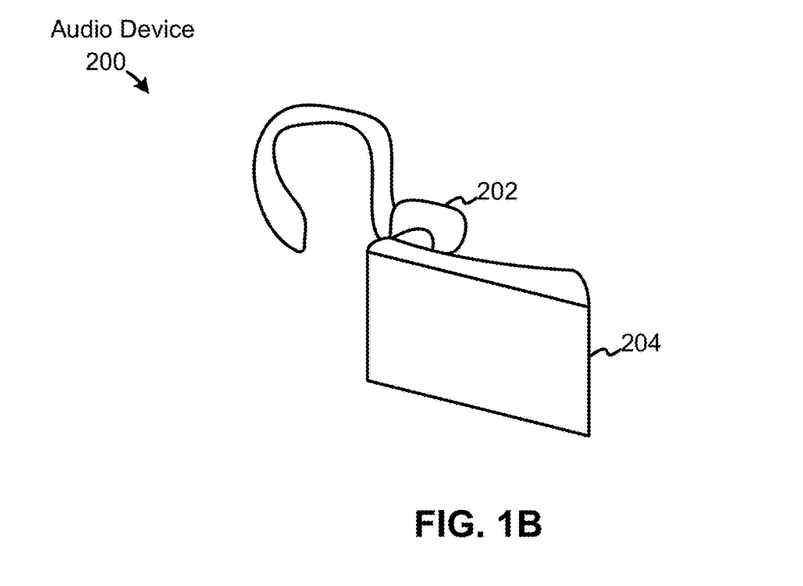
FIG. 1B depicts another example of another audio device configured to adjust a level of volume of an audio signal, according to some embodiments.

FIG. 1B depicts another example of an audio device configured to adjust a level of volume of an audio signal, according to some embodiments. In some embodiments, audio device 200 includes a wired or wireless headphone (e.g., a Bluetooth headphone or ear bud.) configured to transmit and receive audio data via wireless a network. Audio device 200 may include a speaker 202 and a microphone 204. According to some embodiments, audio device 200 can further include one or more of an acoustic control processor, a memory, an AMP, a converter, an audio source, a sensor and a power source, none of which are depicted.

Figure 2:
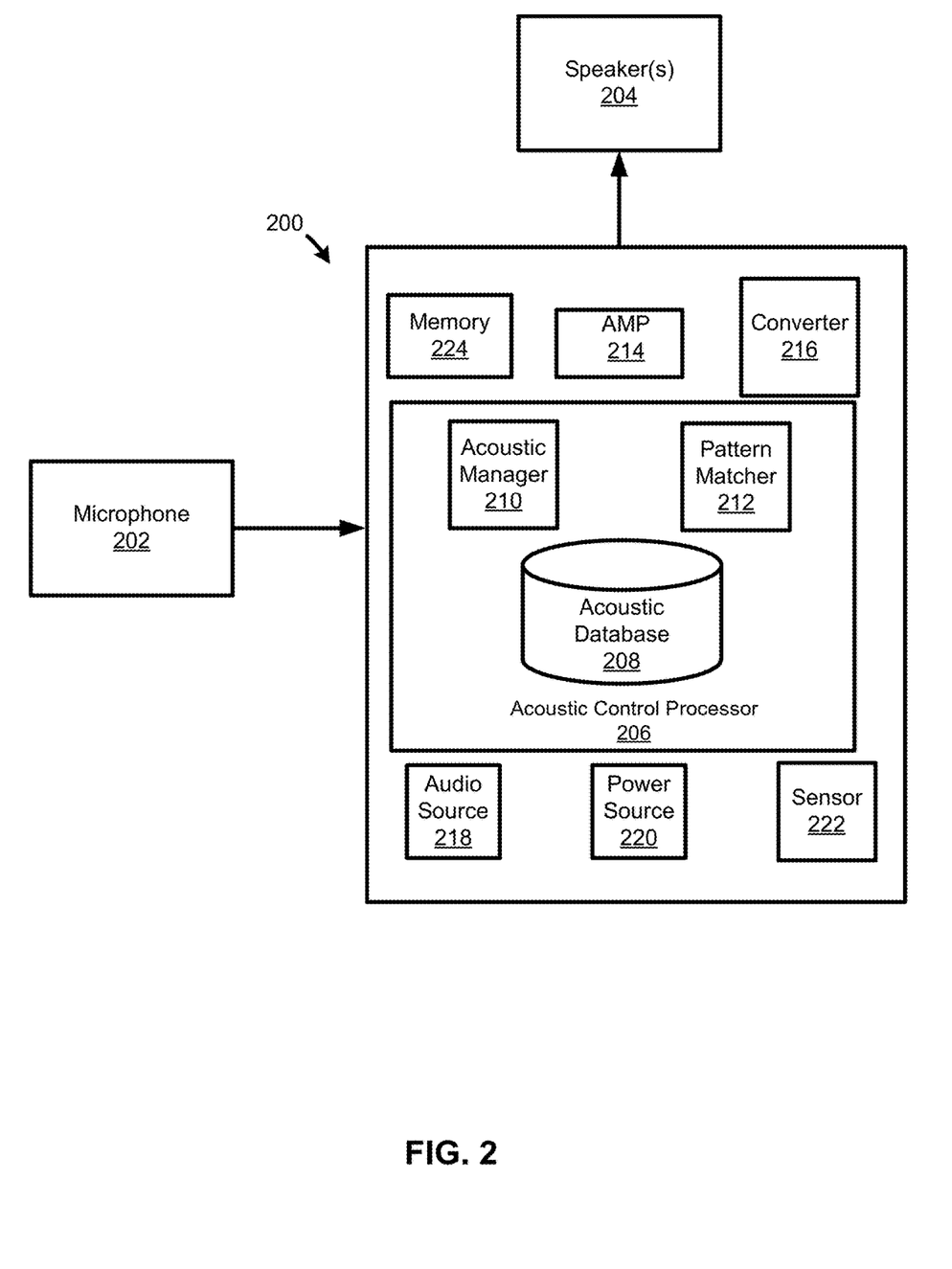
FIG. 2 is a block diagram illustrating an example of an audio device configured to a level of volume of an audio signal, according to some embodiments.

FIG. 2 is a block diagram illustrating an example of an audio device 200 configured to adjust a level of volume of an audio signal, according to some embodiments. For example, audio device 200 includes, without limitation, to a microphone 202, one or more speakers 204, a memory 224, an AMP 214, a converter 216, an acoustic control processor 206, an acoustic database 208, an acoustic manager 210, a pattern matcher 212, an audio source 218, a power source 220, and one or more sensors 222.

According to some embodiments, one or more sensors 222 housed in audio device 200 may be configured to receive or otherwise determine proximity digital data representing a spatial direction of the ambient sound source. In some embodiments, one or more sensors 222 can be configured to receive location data of a computing wearable device transmitted from the computing wearable device (not shown). Examples of components or elements that implement sensor 222, including those components used to determine proximity of an sound source (e.g., of a user), are disclosed in U.S. patent application Ser. No. 13/831,422, entitled "Proximity-Based Control of Media Devices," filed on Mar. 14, 2013, which is incorporated herein by reference.

Speakers 204 can be configured to generate a foreground sound generated by audio source 218, according to some embodiments. In some examples, a foreground sound represents desired audio, such as music or voiced audio, that a listener is principally focused upon. Microphone 202 is configured to receive, among other things, an ambient sound to transform the ambient sound into analog sound signals. Microphone 202 is further configured to communicate with converter 216, which can be configured to convert the received analog ambient signals into digitized ambient sound signals. Also, the ambient sound signals can be conveyed to acoustic control processor 206. Power source 220 housed in audio device 200 is configured to energize audio device 200.

Such ambient sound signals include information describing one or more characteristics of the ambient sound, such as intensity, frequency, timbre, and spatial direction, and the like. At least some of these characteristics can be embodied in data representing a waveform (e.g., depicted as a waveform diagram. For example, sound intensity (measured in dB) may be reflected in the amplitude line (y axis) of the waveform, and sound frequency (measured in Hz) may be reflected in the time line (x axis) of the waveform. Timbre, often described as the harmonic content of the sound, may be embodied in the shape of the waveform. In addition, because a sound may contain multiple frequencies, a fundamental frequency may be used to describe the sound. Besides the waveform data, other data can be used, too. For example, a spatial direction indicating the ambient sound's relative location to the audio device may be represented by location parameters (e.g., represented by one or more points in an x, y, z coordinate system).

Acoustic control processor 206 is configured to receiving the ambient sound signals, and to implement one or more of acoustic database 208, acoustic manager 210 and pattern matcher 212. In some examples, acoustic control processor 206 is configured to detect that one or more characteristics of ambient sound signals meet one or more criteria, and, in response, acoustic control processor 206 performs one or more actions. For example, acoustic control processor 206 can detect whether values (e.g., magnitudes) of the ambient sound signals reach a threshold intensity (e.g., a range of decibel values in the intensity of the ambient sound signals). The threshold intensity can be static or dynamic, and it can be determined automatically or manually. According to some embodiments, acoustic manager 210 may determine the threshold intensity as a function of a sound level that may interfere with the propagation of foreground sound signals, which, in turn, likely interferes with the hearing/perception of the foreground sound. An example of such threshold intensity is the sound intensity of a normal conversation near or about 60 dB. In some embodiments, the threshold intensity may be dynamically associated to the foreground sound volume. For example, a larger foreground sound volume may cause acoustic control processor 206 to set a higher threshold intensity. According to other embodiments, a user may manually set the threshold intensity.

In instances when the ambient sound signals reaches a threshold intensity, acoustic control processor 206 is configured to analyze data representing the ambient sound, including data describing one or more characteristics of the ambient sound, such as intensity, frequency, timbre, and spatial direction, and the like. Based on the results of the analysis, acoustic control processor 206 can adjust the output volume (e.g., the level of volume of propagated audio signals).

Further, acoustic control processor 206 can implement acoustic manager 210 and pattern matcher 112 to perform the analysis. Acoustic manager 210, in communication with acoustic control processor 206, is configured to select sample data representing at least one of the acoustic characteristics, the sample data being determined for used by pattern matcher 112 to detect matches against database 208. The acoustic characteristic data can be selected from data representing the ambient sound signals. In some embodiments, acoustic manager 210 may apply multiple factors to select the sample data which are representative in describing the ambient sound signals. Examples of the multiple factors include: an intensity range of the ambient sound signal, a fundamental frequency of the ambient sound (or frequency range of the same), and the like. To illustrate, consider that when the ambient sound intensity and fundamental frequency are within the range of a human voice (e.g. sound intensity at 60~80 dB, fundamental frequency at 85~255 Hz), acoustic manager 210 may select digital data describing, for example, a 1-second waveform diagram as the sample data. By determining ambient sound relates to a voice, then further analysis can be performed to determine if it is intended to be communicated or whether it interferes with the foreground sound. In another example, when the ambient sound signals does not include a fundamental frequency, acoustic manager 210 may select digital data representing the frequency range and proximity as the sample data. Yet in another example, acoustic manager 210 may select sample data representing a predominant amount or all of the acoustic characteristics of the ambient sound signals.

Pattern matcher 212, in communication with acoustic control processor 206, is configured to compare the sample data with data stored in a plurality of acoustic files (not shown), according to some embodiments. In some cases, pattern matcher 212 may perform a comparison using an acoustic-file matching technique described in FIG. 3. Referring back to FIG. 2, acoustic database 208 is configured to store data in a plurality of acoustic files for the acoustic-file matching process, according to some embodiments. Further, pattern matcher 212 can be further configured to determine a category of the ambient sound signals. According to some embodiments, categories of the ambient sound signals include, for example, (1.) a response-solicitation sound category, and (2.) a non-response-solicitation sound category. In some embodiments, the non-response-solicitation sound category further may include a void sound sub-category.

The first category includes those sounds that solicits (or expects to solicit) an active response from a listener. According to some embodiments, a "response-solicitation sound" can refer, at least in some cases, to sounds that are generated to solicit are response or cause the listener to take a particular course of action. Generally, a response-solicitation sound causes the listener's attention to focus on the first category of sounds, and, as such, ought not be concealed or ignored by the listener (e.g., due to interference with the audio). Therefore, upon determining an ambient sound by pattern matcher 212 as a response-solicitation sound, a foreground sound of an audio device (which may conceal the response-solicitation sound) may be reduced to allow a listener to hear the response-solicitation sound and properly respond to it. That is, pattern matcher 212 instructs acoustic control processor 206 to adjust the foreground sound so that the listener can detect, perceive or otherwise hear the ambient sound. An example of a response-solicitation sound is a siren of a police vehicle, which is intended to alert a listener to take action to, for example, yield to a police vehicle. Another example is a baby's crying, as the crying sound is instinctively generated to alert the listener to comfort the baby. Other examples of the response-solicitation sound include a door ring, a user's conversation in a phone call, and the like.

The second category includes those sounds that need not require, or is not necessarily generated to solicit, an response (e.g., an active response by a listener. According to some embodiments, a "non-response-solicitation sound" can refer, at least in some cases, to sound that a listener need not respond to, or is generated without regard to the listener. Generally, a non-response-solicitation sound may be neglected by a listener. In a predominant number of cases, a non-response-solicitation sound is a sound that likely interferes with the desired audio, such a foreground sounds, in which the listener is engaged. Therefore, upon determining an ambient sound by pattern matcher 212 as a non-response-solicitation sound, acoustic control processor 206 is configured to adjust a foreground sound of an audio device. That is, an output volume or sound level of propagate audio signals may be increased to offset any auditory interferences caused by the non-response-solicitation sound. An example of the non-response-solicitation sound is the relatively loud sound of water hitting a tub or floor in a shower. This sound is one that does not require the listener to respond to it. Another example is the background noise from a busy street when a listener walks through it. Other examples of the non-response-solicitation sound include sounds of traffic, audio from a television, a neighbor's dog barking, a background sound of a restaurant, and the like.

Further, a sub-category of the second category, which is optional, is described as follows. The sub-category includes those sounds that likely to do not interfere with the propagation of the desired audio. In particular, a "void sound," at least in some examples, refers to a non-response-solicitation sound that need not or does not interfere with the listener's hearing of the foreground sound. As such, acoustic control processor 206 can forego modifying the output volume. Thus, when pattern matcher 212 determines a void sound is present, pattern matcher 212 can disable or cancel a need to increase the foreground sound. A void sound is an exception and a sub-category of the non-response-solicitation sound. An example of a void sound is a relatively low-level sound close to an audio device, but far from a listener of the audio device. Thus, even though the low-level sound is a non-response-solicitation sound (as it does not require a listener's active response), the vacuum sound may not lead to an increased foreground sound because it does not interfere with the listener's hearing of the foreground sound.

Based on the categorization of an ambient sound signal, acoustic control processor 206 is configured to adjust the audio signals to change the output volume according to the category of the ambient sound signal. For example, a baby's crying sound, being determined as a response-solicitation sound, may cause the audio device to lower the foreground sound. In another example, a busy street noise, being determined as a non-response-solicitation sound, may cause the audio device to increase the foreground sound. According to some embodiments, acoustic control processor 206 is further configured to determine an adjustment amount for the acoustic signals. In some embodiments, the adjustment amount may be related to the ambient sound intensity, whereby an output volume increases either linearly or non-linearly with increases in the sound levels of the ambient sounds. In some cases, the adjustment amount may be subject to a maximum amount such that the output volume ceases to increases in corresponding increases of the intensity of the ambient sound. According to other embodiments, acoustic control processor 206 is further configured to detect a reduction or elimination as a dissipation of the ambient sound signals, and cancel the adjustment in the audio signals. A dissipation of the ambient sound signals indicates the intensity of the ambient sound reaching below the threshold intensity that triggers the adjustment in the audio signals.

Figure 3:
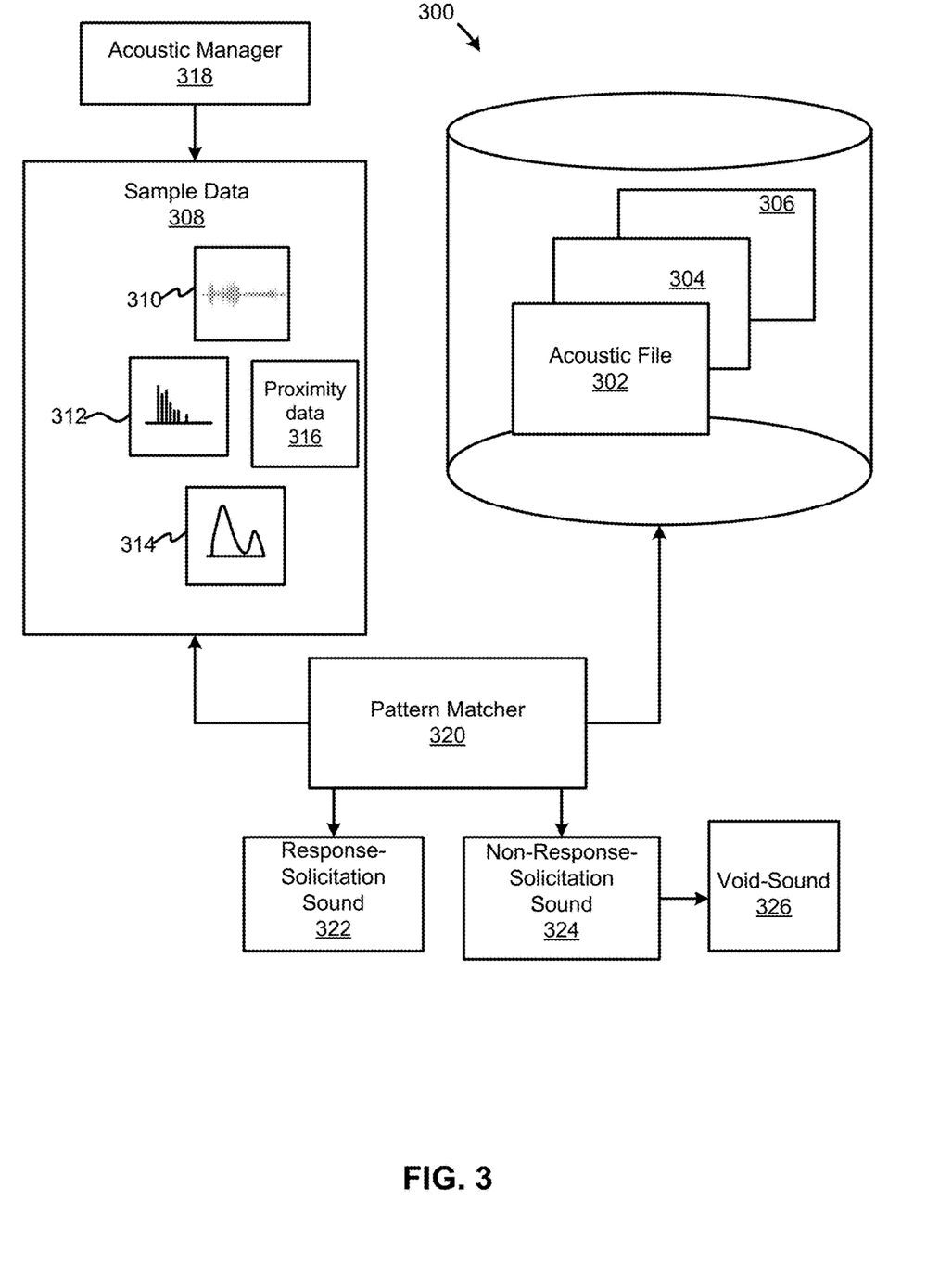
FIG. 3 illustrates an example of a pattern matcher configured to communicate with an acoustic control processor, according to some embodiments.

FIG. 3 illustrates a pattern matcher 320 implementing sample data 308 that is selected by an acoustic manager 318, according to some embodiments. Also shown is an acoustic database 300 configured to store data in a plurality of acoustic files, including acoustic file 302, 304 and 306. Each acoustic file 302, 304 and 306 may contain data representing various sound signals, such as a siren sound, a user's voice, common traffic noise, a doorbell sound, baby's crying sound, and the like. For example, acoustic file 302 may contain data representing both a waveform diagram for a siren sound and data describing fundamental frequency ranges of the siren sound. In some embodiments, acoustic database 300 may be stored within the audio device. In other embodiments, acoustic database 300 may be stored in another server in communication with the audio device. Furthermore, data in acoustic files, such as acoustic file 302, can be amended or deleted as needed. For example, data representing a user's voice waveform can be added to the acoustic file to assist identifying the user's voice. As such, a user can activate an acoustic control processor to record or capture common noises experienced, for example, in a room at a given time of day. This data is stored as an acoustic file and can be used to identify common noises in the future with matches to the acoustic file. As it is a common noise that is captured with indications that it is a non-response-solicitation sound, an acoustic control processor can be configured to filter out the common noises. In some embodiments, sample data 308 may represent some or all acoustic characteristics of the ambient sound signals (e.g., waveform diagram 310, frequency 312, intensity 314, and proximity digital data 316).

According to some embodiments, pattern matcher 320 is configured to compare sample data, including one or more of waveform diagram 310, frequency 312 (or ranges of frequency), intensity 314, and proximity data 316, with data stored in acoustic files 302, 304, and 306. In an example, pattern matcher 320 may perform an acoustic-file matching process by comparing sample digital data 308 with data stored in each acoustic file 302, 304 and 306 until a match is determined. In one example, the match in the pattern may be a precise match between the two compared files (e.g., the same fundamental frequency). In another example, the match maybe a less-precise match (e.g., two fundamental frequencies fall within a range). A pattern match identifies an ambient sound signals' source, such as a police car's siren, or a baby's cry.

According to some embodiments, pattern matcher 320 is further configured to determine a category of the ambient sound signals. According to some embodiments, a category of the ambient sound signals includes a response-solicitation sound category 322 and a non-response-solicitation sound category 324. In some embodiments, the non-response-solicitation sound category further includes a void sound sub-category 326.

Figure 4:
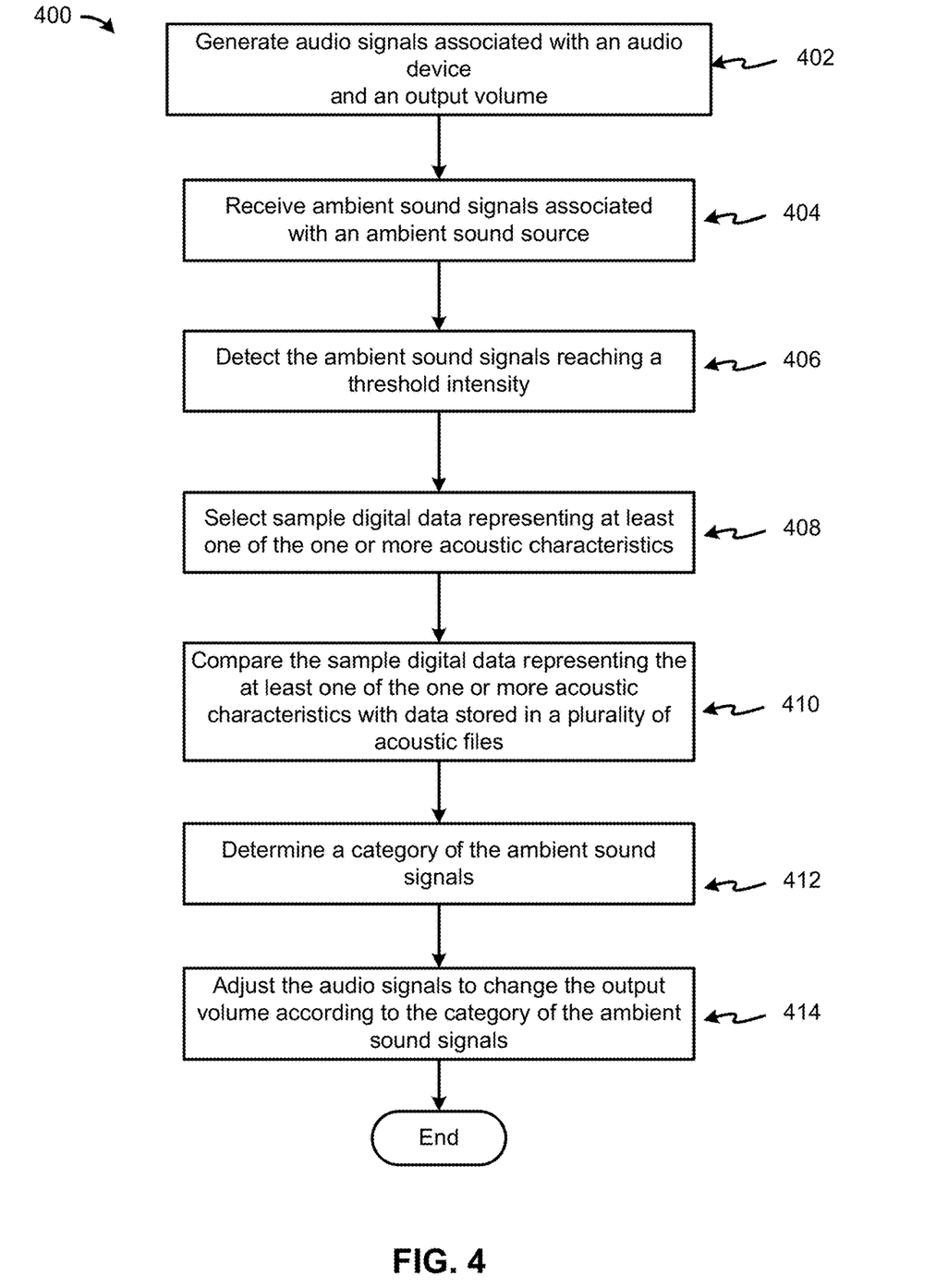
FIG. 4 is an example flow diagram for adjusting the audio signals to change a level of volume of an audio signal, according to some embodiments.

FIG. 4 is an example flow diagram 400 for adjusting the audio signals to change a level of volume of an audio signal, according to some embodiments. At 402, flow diagram 400 begins with generating audio signals associated with an audio device and an output volume (e.g., at a level of volume of an audio signal). At 404, flow diagram 400 follows with receiving ambient sound signals associated with an ambient sound source. At 406, flow diagram 400 follows with the detection of the ambient sound signal reaching one or more threshold intensities. At 408, sample data representing at least one of the one or more acoustic characteristics is selected. At 410, the sample data representing an acoustic characteristic is compared with a plurality of acoustic files, with a category of the ambient sound signals being determined at 412. At 414, audio signals are adjusted to change the output volume as a function of the category of the ambient sound signals.

Figure 5:
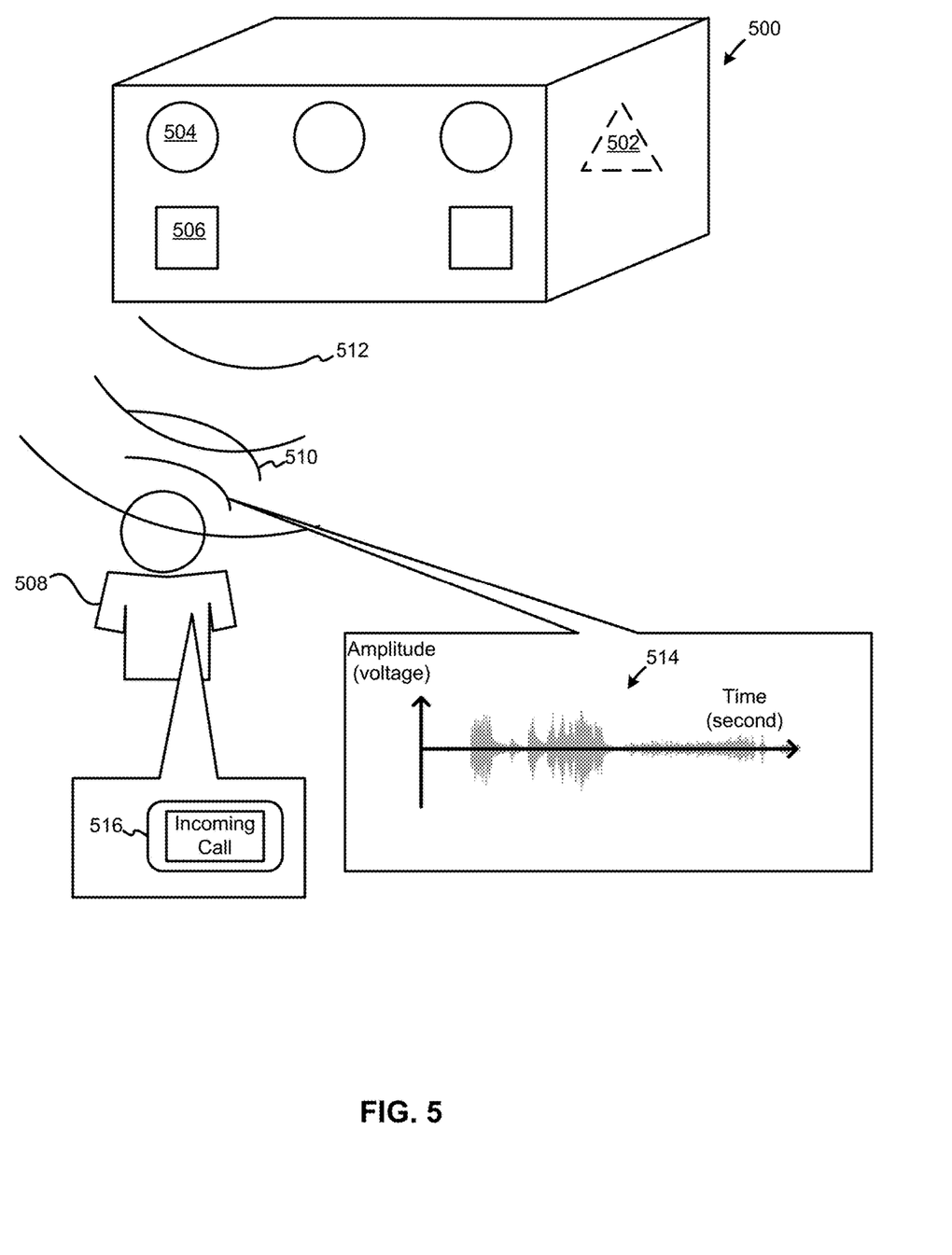
FIG. 5 illustrates an example of an audio device configured to decrease a level of volume of an audio signal, according to some embodiments.

FIG. 5 illustrates an example of an audio device 500 configured to decrease a level of volume of an audio signal, according to some embodiments. Audio device 500 includes a wired or wireless audio speaker, or a portable wireless Bluetooth-based speaker. Audio device 500 can also include, without limitation, to an audio control processor 502, one or more speakers 504, and one or more microphone 506. In this example, audio device 500 is configured to play music 512 in an environment.

A listener 508 can set a first volume of music 512 at which to enjoy the music. During the playing of the music 512, listener 508 receives a call and starts to talk over phone 516, generating a user voice 510. Microphone 506 is configured to receive user voice 510 associated with ambient sound signals. According to the descriptions aforementioned, audio control processor 502 is configured to detect that user voice 510 reaches a threshold intensity, such as 60 dB, and to analyze data representing the user voice 510. The analysis is performed to determine whether to select sample data, such as data representing a waveform of user sound 514. Audio device 500 can compare data representing waveform of user sound 514 with data stored in a plurality of acoustic files until a match is found, and detect that user sound 514 is a response-solicitation sound because it solicits an active conversation (response) from user 508. Based on the categorization as a response-solicitation sound, audio control processor 502 is configured to reduce the first volume of music 512 to a second level, enabling listener 508 to talk over phone 510 with minimal interference from foreground music sounds. According to some embodiments, after listener 508 hangs up phone 516, audio control processor 502, upon detecting the user voice 510 falls below the threshold intensity, can cause the first volume of music 512 to be re-established.

Figure 6A:
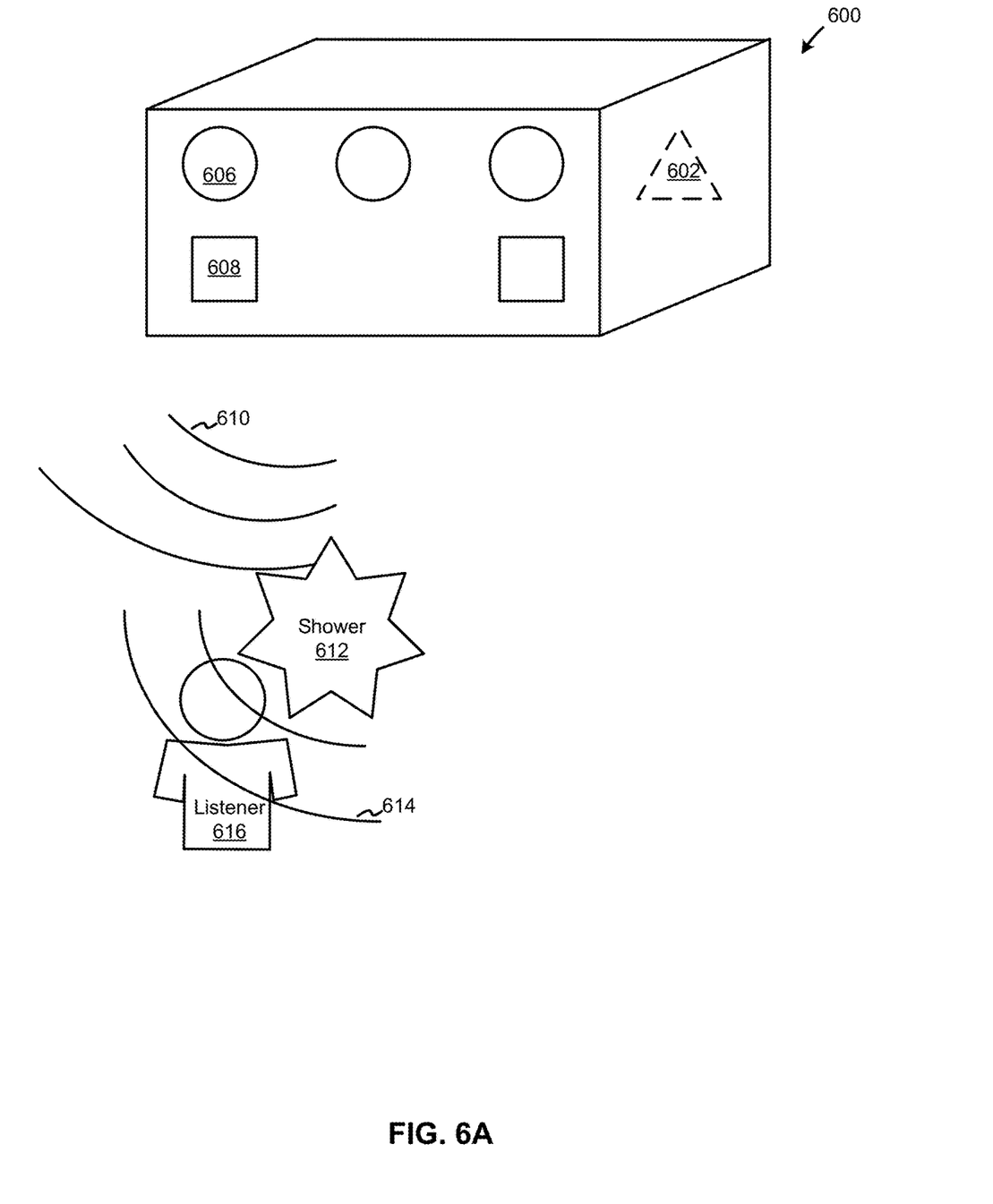
FIG. 6A illustrates an example of an audio device configured to increase a level of volume of an audio signal, according to some embodiments.

FIG. 6A illustrates an example of an audio device 600 configured to increase a level of volume of an audio signal, according to some embodiments. Referring to FIG. 6A, audio device 600 includes a wired or wireless audio speaker, or a portable wireless Bluetooth Speaker. Audio device 600 includes, without limitation, to an audio control processor 602, one or more speakers 606, and one or more microphones 608. Audio device 600, at least in this example, is configured to play music 610 in an environment.

A listener 616 can select a first volume of music 610 at which to enjoy the music. During the playing of the music 610, listener 616 enters a shower 612 in which a shower sound 614 is generated by water forcefully hitting the tub or tile. Thus, shower sound 614 may cause listener 616 to have difficulty in hearing music 610 at the first volume. According to the various implementations described herein, audio control processor 602 is configured to detect that shower sound 614 reaches a threshold intensity, such as 80 dB, and then analyzes digital representing shower sound 614, whereby sample data is selected (e.g., sample data representing a frequency range of shower sound 614). After selecting the sample data, audio control processor 602 can compare data representing the frequency range of shower sound 614 with data stored in a plurality of frequencies until a match is determined. Upon determining a match for shower sound 614, shower sound 614 can be identified as a non-response-solicitation sound because it does not require an action (response) from listener 616, among other reasons. Furthermore, audio control processor 602 is configured to increase the first volume of music 610 to a second level, allowing listener 616 to enjoy music 610 in shower 612.

Figure 6B:
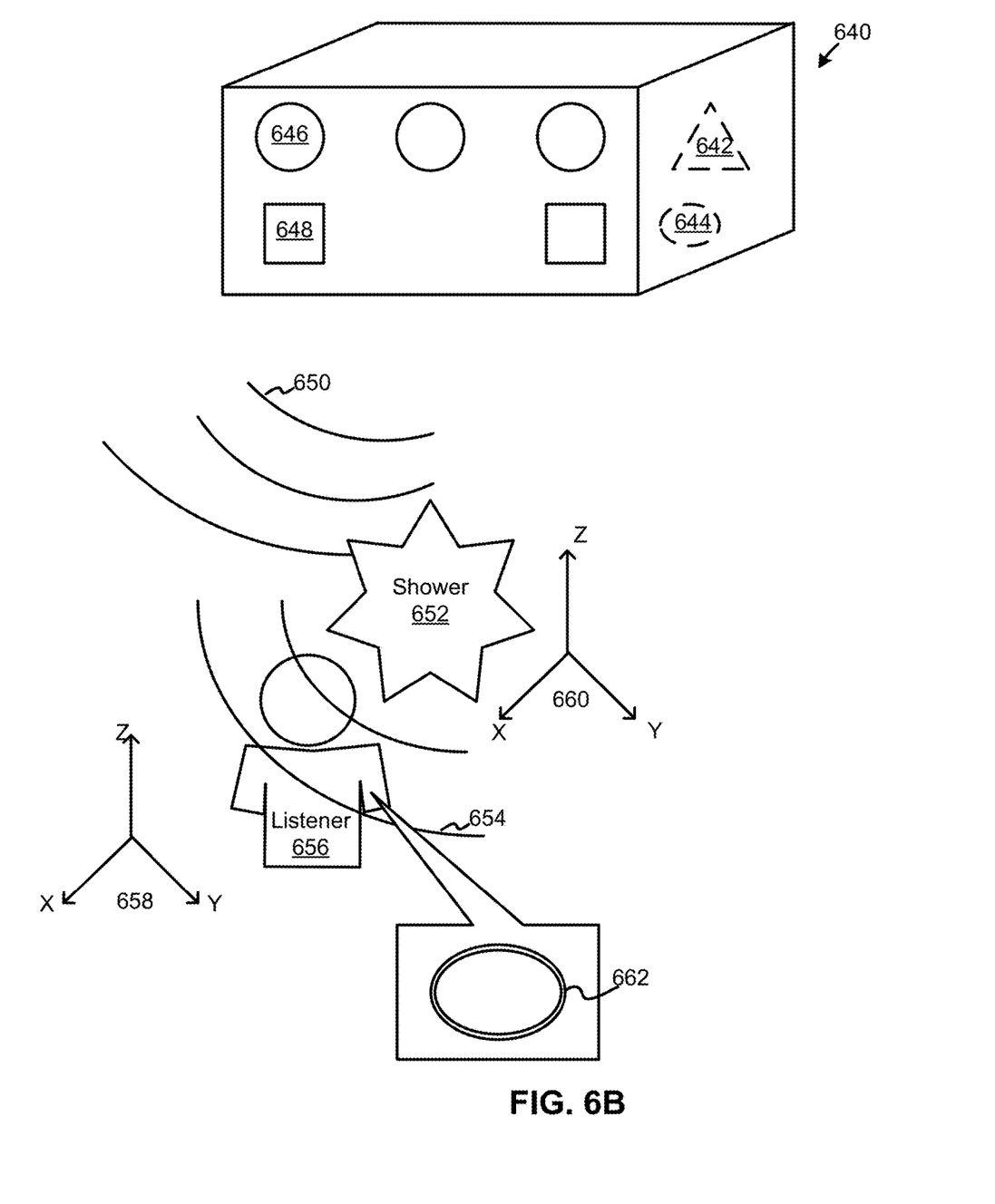
FIG. 6B illustrates another example of an audio device configured to increase a level of volume of an audio signal in association with a wearable computing device, according to some embodiments.

FIG. 6B illustrates another example of an audio device 640 configured to increase a level of volume of an audio signal in association with a wearable computing device 662, according to some embodiments. An audio device 640 can include, without limitations, to an audio control processor 642, a speaker 646, a microphone 648, and a location sensor 644. According to some embodiments, location sensor 644 is configured to receive data (e.g., GPS data, proximity data, etc.) describing a listener location 658, for example, transmitted from a computing wearable device 662 worn by a listener 656. In some embodiments, location sensor 644 is further configured to receive proximity digital data representing shower location 660 or the location of audio device 640. In some cases, location sensor 644 is configured to derive data representing listener location 658.

According to some embodiments, listener 656 can determine a first volume of music 650 at which to enjoy the music. During the playing of music 650, a shower 652 is turned on, generating a shower sound 654. Audio control processor 642 is configured to detect shower sound 654 reaching a threshold intensity, such as 80 dB, and then analyzes data representing shower sound 655 to select sample digital data (e.g., data representing a frequency range of shower sound 654, as well as data representing shower location 660 (X1, Y1 and Z1)). Audio control processor 642 can compare data representing the frequency range of shower sound 654 with data stored in a plurality of frequencies, and compare the proximity data representing shower location 660 (X1, Y1 and Z1) with the data describing listener location 658 (X2, Y2 and Z2) transmitted from computing wearable device 662. Even though a shower sound may be presumed to be a non-response-solicitation sound, if shower location 660 is within a threshold range, such as 3 ft., to listener location 658 (indicating listener 656 is in shower 652), shower sound 654 is determined as a non-response-solicitation sound because it indeed interferes with listener 656's hearing of the music. Accordingly, audio control processor 642 is configured to increase the first volume of music 650 to a second level, allowing listener 656 to enjoy music 650 in shower 652. If shower location 660 is outside of a threshold range, such as greater than 3 ft., to listener location 658 (indicating listener 656 is in not in shower 652), shower sound 654 is then determined as the void sound sub-category as shower sound 654 need not interfere with listener's enjoyment of music 650. Accordingly, audio control processor cancels the adjustment of the first volume of music 650.

Figure 7A:
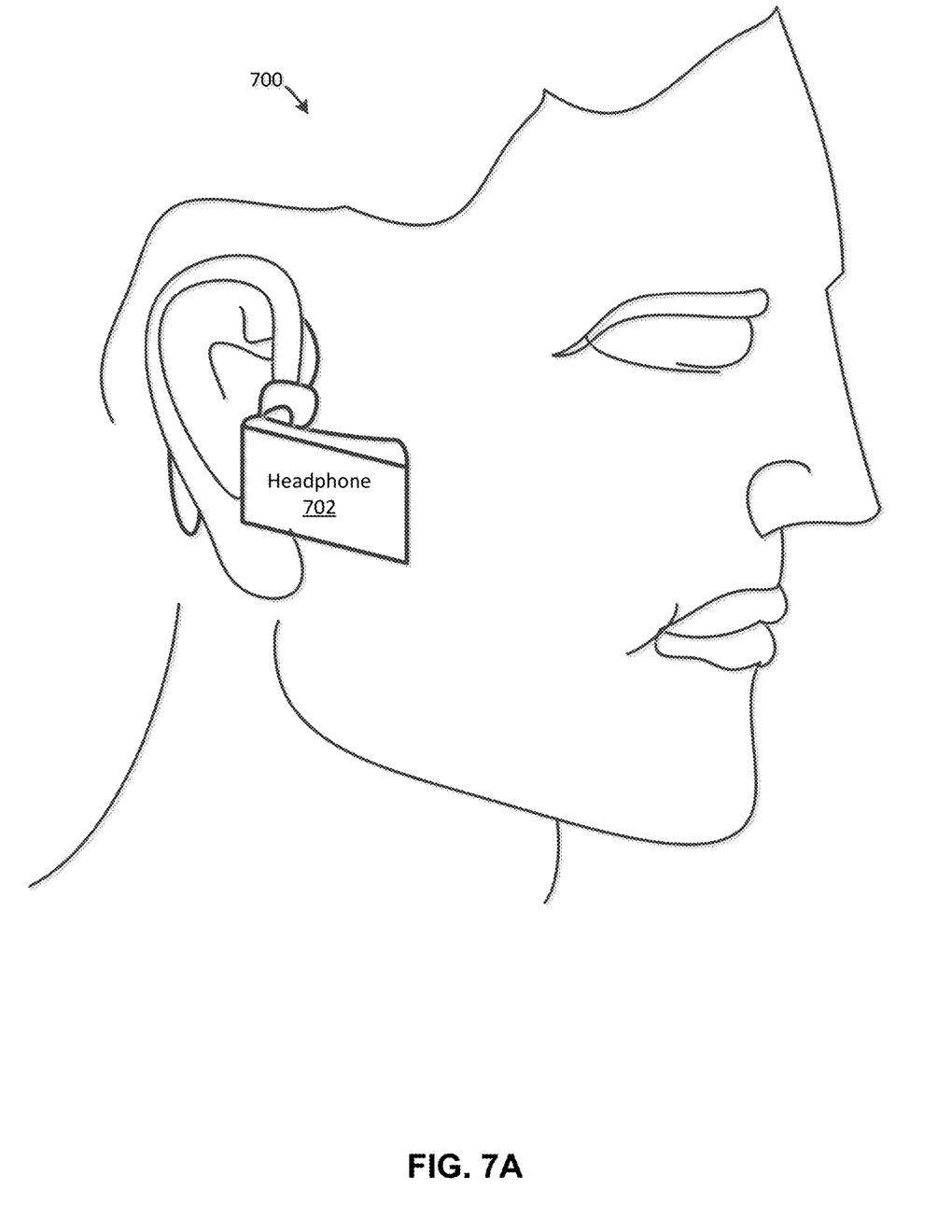
FIG. 7A illustrates another example of an audio device configured to adjust a level of volume of an audio signal, according to some embodiments.

FIG. 7A illustrates another example of a headphone 702 configured to adjust a level of volume of an audio signal for a user 700, according to some embodiments. Referring to FIG. 7A, headphone 702 includes a wireless Bluetooth headphone.

Figure 7B:
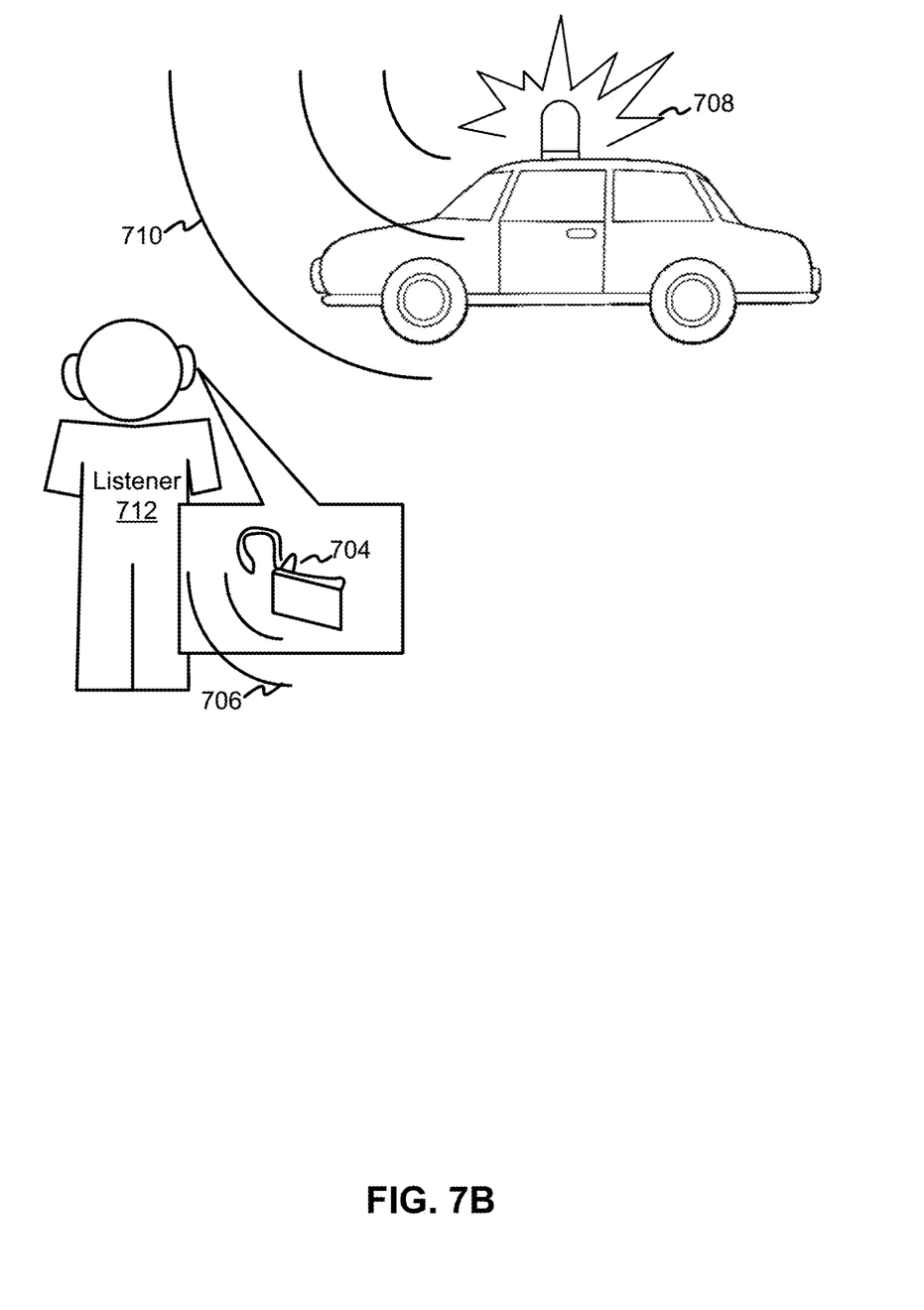
FIG. 7B illustrates another example of an audio device configured to decrease the output volume, according to some embodiments.

FIG. 7B illustrates another example of a headphone 704 configured to decrease the output volume, according to some embodiments. Headphone 704 can also represent one or more wearable speakers, such as ear buds. Referring to FIG. 7B, a listener 712 uses a headphone 704 to listen to music 706 at a first volume. According to some embodiments, headphone 702 includes one or more of the components described herein (not shown). Near listener 712, a siren sound 710 is generated by a police car 708. An audio control processor can be configured to detect siren sound 710 reached a threshold intensity, such as 100 dB, and analyze data representing siren sound 710 to select sample data (e.g., data representing a waveform of siren sound 710). The audio control processor can compare data representing the waveform of siren sound 710 with data stored in a plurality of acoustic files (not shown), and detect that siren sound 710 is a response-solicitation (i.e., it requires listener 702 to yield (or otherwise actively respond) for police car 708. Furthermore, audio control processor is configured to reduce the first volume of music 706 to a second level (or even silence) music 706, alerting listener 712 to yield police car 708.

Figure 8:
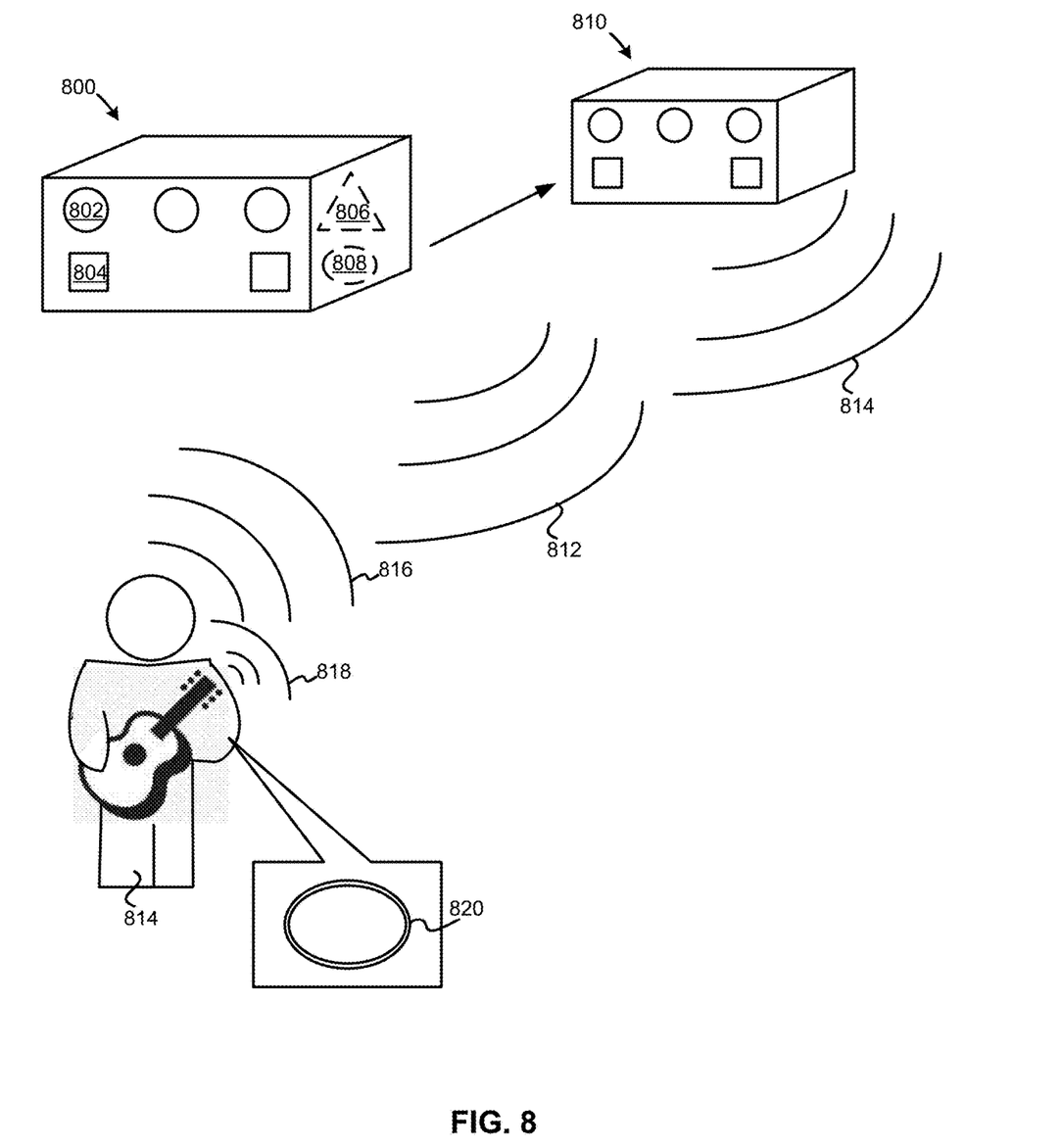
FIG. 8 illustrates another example of an audio device configured to adjust a level of volume of an audio signal in association with a wearable computing device and another audio device, according to some embodiments.

FIG. 8 illustrates another example of a wireless speaker 800 configured to adjust a level of volume of an audio signal in association with a wearable computing device 820 and another wireless speaker 810, according to some embodiments. According to some embodiments, wireless speaker 800 plays music 812 through a speaker 802 at a first volume. In some embodiments, a user 814 plays a guitar and generates a guitar sound 818, and/or may sing a song with a user voice 815. In some embodiments, a location sensor 808 housed in wireless speaker 800 is configured to receive proximity data representing an approximate spatial direction of guitar sound 818 and/or user voice 816. In another example, location sensor 808 is further configured to receive location data of user 814 from a computing wearable device 820.

According to the descriptions aforementioned, audio control processor 806 is configured to detect guitar sound 818 and/or user voice 816 reaches respective threshold intensities, such as 80 dB, and analyze digital data representing guitar sound 818 and/or user voice 816 to select sample digital data (e.g., data representing a waveform of guitar sound 818 and/or user voice 816, and proximity digital data of guitar sound 818). Audio control processor 806 can compare data representing the waveform of guitar sound 818 and/or user voice 816 with data stored in a number of waveforms. Also audio control processor 806 can compare the proximity data of guitar sound 818 and/or user voice 816 with data representing user 814's location transmitted from computing wearable device 820. Then, audio control processor 806 can determine the categories of guitar sound 818 and/or user voice 816 as a response-solicitation sound because it requires user 814 to continue singing or playing guitar. Furthermore, audio control processor 806 is configured to reduce the first volume of music 812 to a second level, allowing user 814 to enjoy his singing or playing.

According to some embodiments, wireless speaker 800 and 810 are in configured to communicate with each other and play the same music. However, wireless speaker 810 may be geographically outside of the acoustic space of guitar sound 818 and/or user voice 816. According to some embodiments, wireless speaker 810 is configured to continue to play music 814 at a volume without being influenced by user voice 816 and/or guitar sound 818. In some other embodiments, wireless speaker 810 is configured to lower a volume of music 814 even though it is not within the acoustic space of guitar sound 818 and/or user voice 816.

Figure 9:
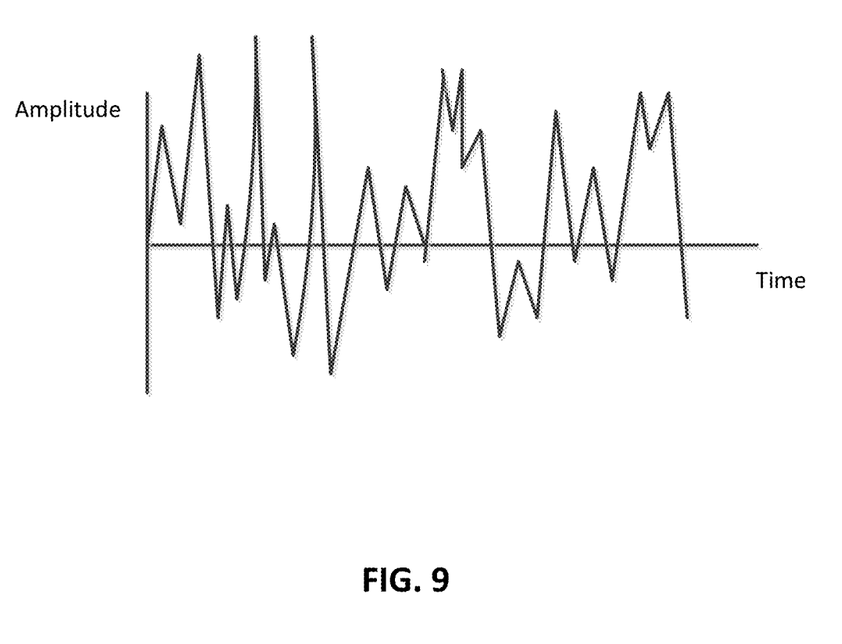
FIG. 9 is an example of a selected sound waveform, according to some embodiments.

FIG. 9 is an example of a random noise wave form, according to some embodiments. FIG. 9 illustrates a random noise waveform may be stored in an acoustic database for comparing and determination a category of the sample digital data, as discussed herein.

Figure 10:
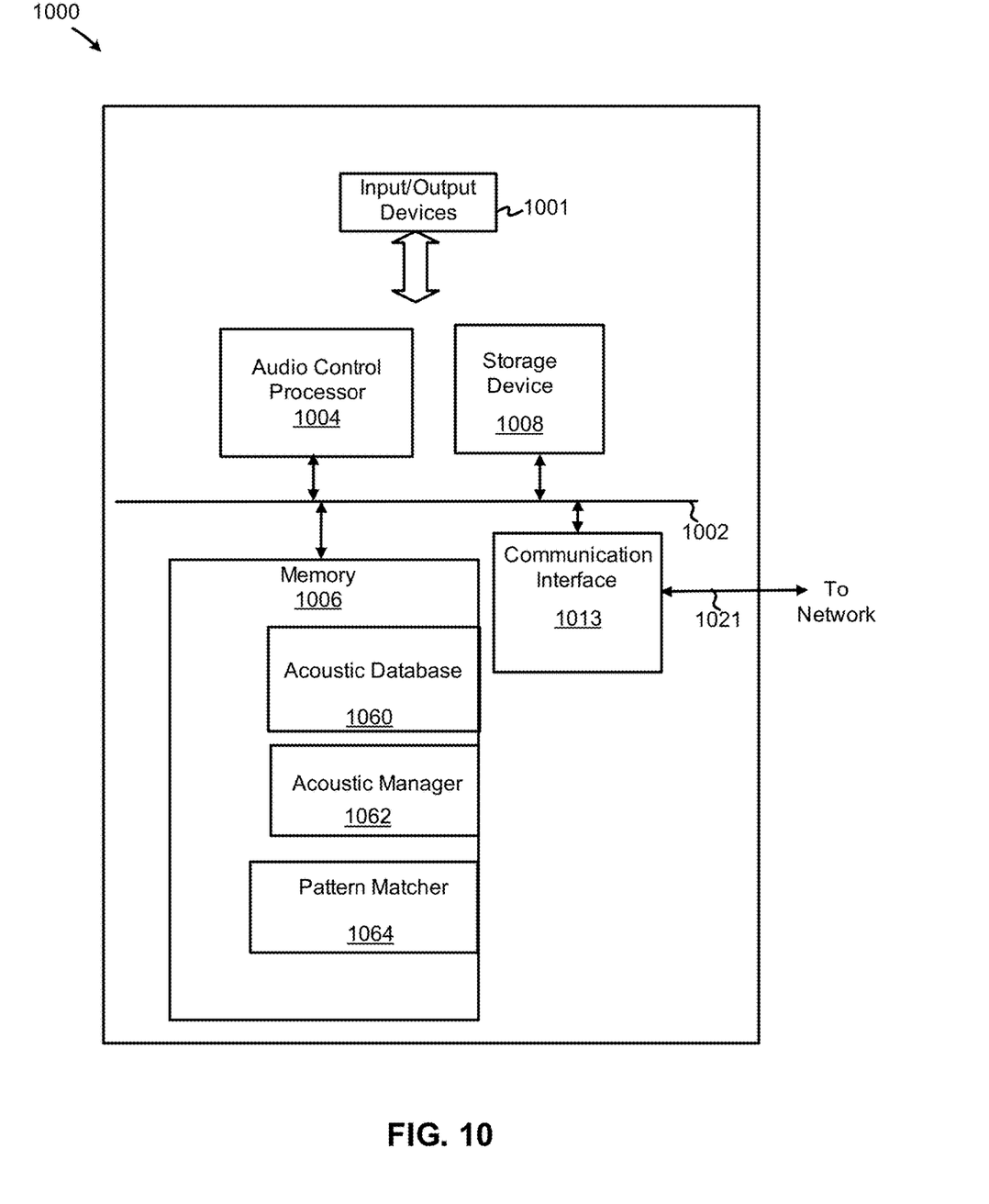
FIG. 10 illustrates an exemplary computing platform disposed in an audio device, according to some embodiments.

FIG. 10 illustrates an exemplary computing platform disposed in audio device, according to some embodiments. In some examples, computing platform 1000 may be used to implement computer programs, applications, methods, processes, algorithms, or other software to perform the above-described techniques. Computing platform 1000 includes a bus 1002 or other communication mechanism for communicating information, which interconnects subsystems and devices, such as processor 1004, system memory 1006 (e.g., RAM, etc.), storage device 1008 (e.g., ROM, etc.), a communication interface 1013 (e.g., an Ethernet or wireless controller, a Bluetooth controller, etc.) to facilitate communications via a port on communication link 1021 to communicate, for example, with a computing device, including mobile computing and/or communication devices with processors. Processor 1004 can be implemented with one or more central processing units ("CPUs"), such as those manufactured by Intel® Corporation, or one or more virtual processors, as well as any combination of CPUs and virtual processors. Computing platform 1000 exchanges data representing inputs and outputs via input-and-output devices 1001, including, but not limited to, keyboards, mice, audio inputs (e.g., speech-to-text devices), user interfaces, displays, monitors, cursors, touch-sensitive displays, LCD or LED displays, and other I/O-related devices.

According to some examples, computing platform 1000 performs specific operations by audio control processor 1004 executing one or more sequences of one or more instructions stored in system memory 1006, and computing platform 1000 can be implemented in a client-server arrangement, peer-to-peer arrangement, or as any mobile computing device, including smart phones and the like. Such instructions or data may be read into system memory 1006 from another computer readable medium, such as storage device 1008. In some examples, hard-wired circuitry may be used in place of or in combination with software instructions for implementation. Instructions may be embedded in software or firmware. The term "computer readable medium" refers to any tangible medium that participates in providing instructions to processor 1004 for execution. Such a medium may take many forms, including but not limited to, non-volatile media and volatile media. Non-volatile media includes, for example, optical or magnetic disks and the like. Volatile media includes dynamic memory, such as system memory 1006.

Common forms of computer readable media includes, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, or any other medium from which a computer can read. Instructions may further be transmitted or received using a transmission medium. The term "transmission medium" may include any tangible or intangible medium that is capable of storing, encoding or carrying instructions for execution by the machine, and includes digital or analog communications signals or other intangible medium to facilitate communication of such instructions. Transmission media includes coaxial cables, copper wire, and fiber optics, including wires that comprise bus 1002 for transmitting a computer data signal.

In some examples, execution of the sequences of instructions may be performed by computing platform 1000. According to some examples, computing platform 1000 can be coupled by communication link 1021 (e.g., a wired network, such as LAN, PSTN, or any wireless network) to any other processor to perform the sequence of instructions in coordination with (or asynchronous to) one another. Computing platform 1000 may transmit and receive messages, data, and instructions, including program code (e.g., application code) through communication link 1021 and communication interface 1013. Received program code may be executed by processor 1004 as it is received, and/or stored in memory 1006 or other non-volatile storage for later execution.

In the example shown, system memory 1006 can include various modules that include executable instructions to implement functionalities described herein. In the example shown, system memory 1006 includes an acoustic database module 1060 configured to store data in the plurality of acoustic files. Acoustic manager module 1062 and pattern matcher module 1064 each can be configured to provide one or more functions described herein.

Although the foregoing examples have been described in some detail for purposes of clarity of understanding, the above-described inventive techniques are not limited to the details provided. There are many alternative ways of implementing the above-described invention techniques. The disclosed examples are illustrative and not restrictive.

What is claimed:
1. A method comprising:
generating audio signals associated with an audio device and an output volume;
receiving ambient sound signals associated with an ambient sound source, the ambient sound signals including one or more acoustic characteristics;
detecting the ambient sound signals reaching a threshold intensity;
analyzing digital data representing the ambient sound signals, wherein said analyzing further comprises:
selecting sample digital data representing at least one of the one or more acoustic characteristics;
comparing the sample digital data representing the at least one of the one or more acoustic characteristics with data stored in a plurality of acoustic files; and
determining a category of the ambient sound signals based at least in part on the comparison, and
adjusting the audio signals to increase the output volume of the audio signals when the category is determined to be a category associated with a non-response-solicitation sound that is deemed to interfere with a listener's hearing of the audio signals.
2. The method of claim 1, wherein the one or more acoustic characteristics are selected from the group consisting of intensity, frequency, timbre, and spatial direction.
3. The method of claim 1, wherein the output volume is increased to offset auditory interferences caused by the non-response-solicitation sound.
4. The method of claim 1, further comprising:
foregoing adjustment of the audio signals when the category is determined to be a category associated with a non-response-solicitation sound that need not or does not interfere with the listener's hearing of the audio signals.

5. The method of claim 1, further comprising:
receiving proximity digital data representing a spatial direction of the ambient sound source via one or more sensors housed in the audio device, wherein determining the category of the ambient sound signals is based at least in part on the spatial direction.

6. The method of claim 5, further comprising:
receiving location data transmitted from a computing wearable device via the one or more sensors housed in the audio device, wherein determining the category of the ambient sound signals is based at least in part on the location data.

7. The method of claim 1, wherein adjusting the audio signals to increase the output volume according to the category of the ambient sound further comprises:
determining an adjustment amount in the audio signals.

8. The method of claim 1, further comprising:
detecting a dissipation of the ambient sound signals; and canceling adjusting the audio signals.

9. The method of claim 1, further comprising:
converting the ambient sound signals into digital data representing the ambient sound signals.

10. An apparatus, comprising:
a housing;
an audio source contained in the housing;
one or more audio transducers configured to
generate audio signals associated with the apparatus and an output volume; and
receive ambient sound signals associated with an ambient sound source, the ambient sound signals including one or more acoustic characteristics,
an audio control processor configured to
detect the ambient sound signals reaching a threshold intensity;
analyze digital data representing the ambient sound signals, wherein the audio control processor is further configured to
select sample digital data representing at least one of the one or more acoustic characteristics;
compare the sample digital data representing the at least one of the one or more acoustic characteristics with data stored in a plurality of acoustic files; and
determine a category of the ambient sound signals based at least in part on the comparison, and
adjust the audio signals to increase the output volume of the audio signals when the category is determined to be a first category associated with a non-response-solicitation sound that is deemed to interfere with a listener's hearing of the audio signals.

11. The apparatus of claim 10, wherein the one or more acoustic characteristics are selected from the group consisting of intensity, frequency, timbre, and spatial direction.

12. The apparatus of claim 10, wherein the output volume is increased to offset auditory interferences caused by the non-response-solicitation sound.

13. The apparatus of claim 10, wherein the audio control processor is further configured to:
forego adjustment of the audio signals when the category is determined to be a category associated with a non-response-solicitation sound that need not or does not interfere with a listener's hearing of the audio signals.

14. The apparatus of claim 10, further comprising:
one or more sensors contained in the housing configured to receive proximity digital data representing a spatial direction of the ambient sound source, wherein the audio control processor is configured to determine the category of the ambient sound signals based at least in part on the spatial direction.

15. The apparatus of claim 14, wherein the one or more sensors contained in the housing are further configured to receive location data transmitted from a computing wearable device, and wherein the audio control processor is configured to determine the category of the ambient sound signals based at least in part on the location data.

16. The apparatus of claim 10, wherein the audio control processor further comprises:
an acoustic manager configured to
select sample digital data representing at least one of the one or more acoustic characteristics, and
a pattern matcher configured to
compare the sample digital data representing the at least one of the one or more acoustic characteristics with data stored a plurality of acoustic files; and
determine the category of the ambient sound signals based at least in part on the comparison.

17. The apparatus of claim 10, further comprising
an acoustic database associated with the audio control processor, the acoustic database being configured to store the data in the plurality of acoustic files.

18. The apparatus of claim 10, wherein the audio control processor is further configured to
determine an adjustment amount in the audio signals.

19. The apparatus of claim 10, wherein the audio control processor is further configured to
detect a dissipation of the ambient sound signals; and cancel the adjust in the audio signals.

20. The apparatus of claim 10, further comprising
a converter configured to
convert the ambient sound signals into digital data representing the ambient sound signals.

* * * * *

UNITED STATES PATENT AND TRADEMARK OFFICE
CERTIFICATE OF CORRECTION

| | | |
|---|---|---|
| PATENT NO. | : 11,569,789 B2 | Page 1 of 1 |
| APPLICATION NO. | : 17/494616 | |
| DATED | : January 31, 2023 | |
| INVENTOR(S) | : Nitin Ganatra | |

It is certified that error appears in the above-identified patent and that said Letters Patent is hereby corrected as shown below:

In the Claims

At Column 14, Claim number 16, Line number 33, please add --in-- after "stored"

Signed and Sealed this
Eleventh Day of April, 2023

*Katherine Kelly Vidal*

Katherine Kelly Vidal
*Director of the United States Patent and Trademark Office*